US008124493B2

(12) United States Patent
Komeda (10) Patent No.: US 8,124,493 B2
(45) Date of Patent: Feb. 28, 2012

(54) METHOD OF MANUFACTURING A SEMICONDUCTOR DEVICE HAVING AN ELECTRODE EXPOSED THROUGH A HOLE

(75) Inventor: Kenji Komeda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/846,305

(22) Filed: Jul. 29, 2010

(65) Prior Publication Data
US 2011/0027963 A1 Feb. 3, 2011

(30) Foreign Application Priority Data

Jul. 31, 2009 (JP) ................................ P2009-178907

(51) Int. Cl.
*H01L 21/20* (2006.01)
*H01L 21/311* (2006.01)
(52) U.S. Cl. .......................... 438/396; 438/694; 438/700
(58) Field of Classification Search .................... None
See application file for complete search history.

(56) References Cited

U.S. PATENT DOCUMENTS

| 2004/0036051 | A1* | 2/2004 | Sneh ............................... 251/301 |
| 2004/0228067 | A1* | 11/2004 | Gutsche et al. ............. 361/306.2 |
| 2005/0112819 | A1* | 5/2005 | Kim et al. ..................... 438/239 |
| 2008/0042182 | A1* | 2/2008 | Park .............................. 257/306 |
| 2009/0026531 | A1* | 1/2009 | Poelzl ............................ 257/330 |
| 2009/0146254 | A1* | 6/2009 | Hirota ........................... 257/532 |

FOREIGN PATENT DOCUMENTS
JP 2008-283026 11/2008
* cited by examiner

*Primary Examiner* — Scott B Geyer
(74) *Attorney, Agent, or Firm* — McDermott Will & Emery LLP (57) ABSTRACT

A method of manufacturing a semiconductor device may include, but is not limited to the following processes. A first insulating film is formed over a substrate. A second insulating film is formed on the first insulating film. An electrode penetrating the first and the second insulating films is formed. A part of the second insulating film and a part of the electrode are removed so that a first hole is formed in the second insulating film. A first portion of the electrode is exposed through the first hole. A part of the first portion of the electrode is removed by an isotropic etching.

20 Claims, 10 Drawing Sheets

METHOD OF MANUFACTURING A SEMICONDUCTOR DEVICE HAVING AN ELECTRODE EXPOSED THROUGH A HOLE

BACKGROUND OF THE INVENTION

1. Field of the Invention

The present invention relates to a method of manufacturing a semiconductor device.

Priority is claimed on Japanese Patent Application No. 2009-178907, filed Jul. 31, 2009, the content of which is incorporated herein by reference.

2. Description of the Related Art

With high integration of semiconductor devices, there has been demand for a structure of a higher capacitance capacitor of a DRAM (Dynamic Random Access Memory) memory cell. For this reason, a cylindrical capacitor structure has been developed as a high capacitance capacitor.

With higher integration of semiconductor devices, an electrode of a cylindrical capacitor is made taller in order to increase a larger surface area thereof, and thereby achieve higher capacitance. However, the taller charge storage electrodes of the cylindrical capacitor lack physical stability, and therefore collapse during a manufacturing process, thereby causing a decrease in manufacturing yield.

To solve the above problem, Japanese Patent Laid-Open Publication No. 2008-283026 discloses a method of forming a supporter between adjacent cylindrical capacitors to prevent the cylindrical capacitor from collapsing. Specifically, the method includes the following processes (see FIGS. 4 (*a*) to 4 (*d*), 5 (*a*) to 5 (*e*), 6 (*a*), 8, and 10 of the above document).

Firstly, a capacitor inter-layer film and a support film are sequentially formed. A silicon oxide film and a silicon nitride film are used as the capacitor inter-layer film and the support film, respectively.

Then, a capacitor hole is formed so as to penetrate the support film and to extend into the capacitor inter-layer film. To maximally utilize the memory cell region for forming charge storage electrodes, adjacent capacitor holes are distanced from each other by approximately the minimum feature size of photolithography, and the diameter of the hole is set to be large. Consequently, charge storage electrodes are densely formed in the memory cell region, and the support films are formed in the other region.

Then, a charge storage electrode is formed so as to cover side and bottom surfaces of the capacitor hole. Then, a photoresist mask, which has an opening pattern for forming holes (called pouring holes) in the support film, is formed over the support film using photolithography. Since the charge storage electrodes are densely formed in the region of the support film, it is difficult to form the resist opening pattern so as to expose only an upper surface of the support film. For this reason, the resist opening pattern partially exposes upper surfaces of the support film and the charge storage electrode adjacent to the support film. An edge of the resist opening pattern overlaps the upper surface of the charge storage electrode in plane view.

In some cases, the pouring hole has been required to be increased in diameter in order to enhance circulation of an etching solution and a film forming gas, thereby exposing a larger area of the upper surfaces of the support film and the charge storage electrode (see paragraphs [0061] and [0065] of the above document).

Then, etching is carried out using the photoresist mask to remove a portion of the support film, which is exposed through the resist opening pattern and adjacent to the charge storage electrode, and thus to form the pouring hole. Consequently, a portion of the support film, which is not exposed by the resist opening pattern and therefore remains after the etching, mechanically supports the adjacent charge storage electrodes.

In this case, to surely form a connected portion of the charge storage electrode and the support film in the photolithography process, the photoresist mask has to overlap the charge storage electrode in plane view even if misalignment and a variation in size of the resist opening pattern occur. For this reason, the photoresist mask is designed so as to sufficiently overlap the charge storage electrode in plane view. For example, the photoresist mask is formed so as to cover approximately half the upper surface of the charge storage electrode (see FIGS. 6, 8, and 10 of the above document).

Then, an etching solution is introduced through the pouring hole, and the capacitor inter-layer film is selectively removed by etching so as to expose the outer side surface of the charge storage electrode.

Finally, a gas is provided through the pouring hole to form a capacitor insulating film and an upper electrode by CVD.

However, the inventor of the present invention found that the manufacturing method disclosed in the above document has the following problems.

In the process of forming the pouring hole in the support film by etching with the photoresist mask, high precision of the feature size is required, and therefore dry etching is used. By the dry etching, the support film is removed and the pouring hole is formed. At the same time, an upper portion of the charge storage electrode, which is not covered by the photoresist mask, is partially etched, and therefore a cutout portion is formed.

The cutout portion of the charge storage electrode includes a vertical etching surface and a horizontal surface. The vertical etching surface extends in a direction perpendicular to the substrate. The horizontal surface is in parallel to the substrate. An angled portion is formed at a point where the inner side surface of the charge storage electrode and the vertical etching surface are connected. The angled portion extends in the direction perpendicular to the substrate.

Figure 19:
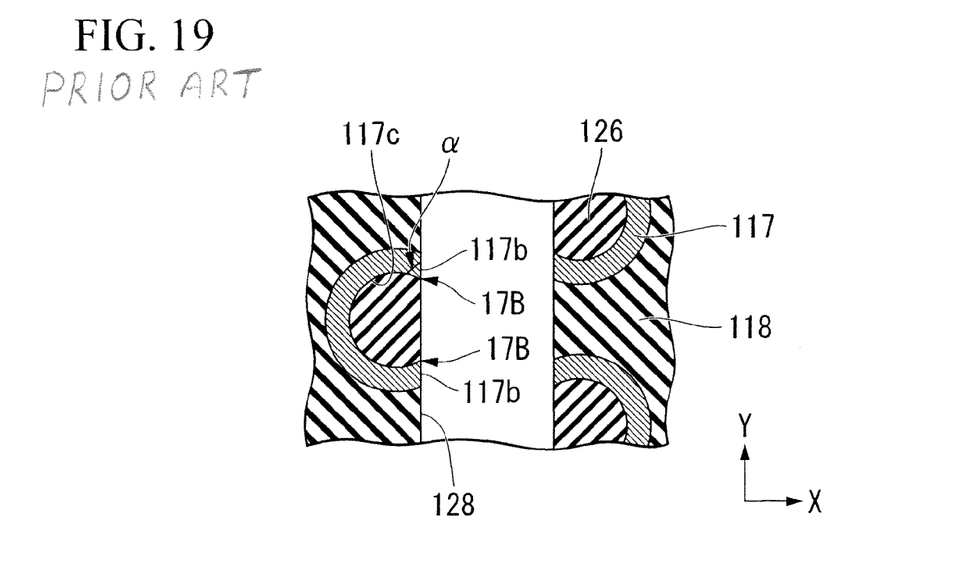
FIG. 19 is a cross-sectional view taken along a plan cutting a support film and illustrates the shape of a charge storage electrode having an angular portion.

FIG. 19 is a cross-sectional view taken along a plan cutting the support film and illustrates the shape of the charge storage electrode including the angled portion. In this example, the opening pattern shown in FIG. 9 of the above document was used. As shown in FIG. 19, an angled portion 117B is formed at an angle of α degrees at the point where the vertical etching surface 117*b* and the inner side surface of the charge storage electrode 117 are connected.

The opening pattern is positioned so as to overlap the charge storage electrode 117 in plan view according to the mask design. However, the position of the edge of the opening pattern, which overlaps the charge storage electrode 117 in plan view, varies in a wafer surface due to misalignment and a variation in size of the opening pattern in the photolithography process. For this reason, a problem that the angle α varies from an acute angle to an obtuse angle arises. FIG. 19 illustrates a case where the charge storage electrode 117 has the angle α of approximately 50 degrees.

When a capacitor includes the charge storage electrode 117 including the angled portion 117B having an acute angle, the capacitor insulating film, and the upper electrode, the strength of the electric field acting on a portion of the capacity insulating film covering the angled portion increases, thereby causing an increase in leakage current. Consequently, an increase in consumption current of a device is likely to occur.

SUMMARY

In one embodiment, a method of manufacturing a semiconductor device may include, but is not limited to the following processes. A first insulating film is formed over a substrate. A second insulating film is formed on the first insulating film. An electrode penetrating the first and the second insulating films is formed. A part of the second insulating film and a part of the electrode are removed so that a first hole is formed in the second insulating film. A first portion of the electrode is exposed through the first hole. A part of the first portion of the electrode is removed by an isotropic etching.

In another embodiment, a method of manufacturing a semiconductor device may include, but is not limited to the following processes. A first insulating film is formed over a substrate. A second insulating film is formed on the first insulating film. A capacitor hole penetrating the second insulating film and the first insulating film is formed. An electrode film covering a bottom surface and a side surface of the first hole is formed. The electrode film on the second insulating film is removed while the electrode film remains in the capacitor hole. A mask is formed on the electrode and the second insulating film. The mask has a second hole. The second hole is disposed over a part of the capacitor hole. A part of the second insulating film and a part of the electrode film are removed by dry etching so that a first hole is formed in the second insulating film. The first hole is defined by the second hole. A first portion of the electrode film is exposed through the first hole. The mask is removed. A part of the first portion of the electrode is removed by an isotropic etching.

BRIEF DESCRIPTION OF THE DRAWINGS

The above features and advantages of the present invention will be more apparent from the following description of certain preferred embodiments taken in conjunction with the accompanying drawings, in which:

FIGS. 2, 3, 4A, 5A, 6, 7A, 8A, 9A, and 10A are cross-sectional views indicative of a process flow illustrating the method of the first embodiment, in which FIGS. 4A, 5A, 7A, 8A, 9A, and 10A are cross-sectional views taken along lines C-C', D-D', F-F', H-H', J-J', and L-L' shown in FIGS. 4B, 5B, 7B, 8B, 9B, and 10B, respectively;

DETAILED DESCRIPTION OF THE PREFERRED EMBODIMENTS

The present invention will now be described herein with reference to illustrative embodiments. The accompanying drawings explain a semiconductor device and a method of manufacturing the semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention and that the present invention is not limited to the embodiments illustrated herein for explanatory purposes.

First Embodiment

Figure 1A:
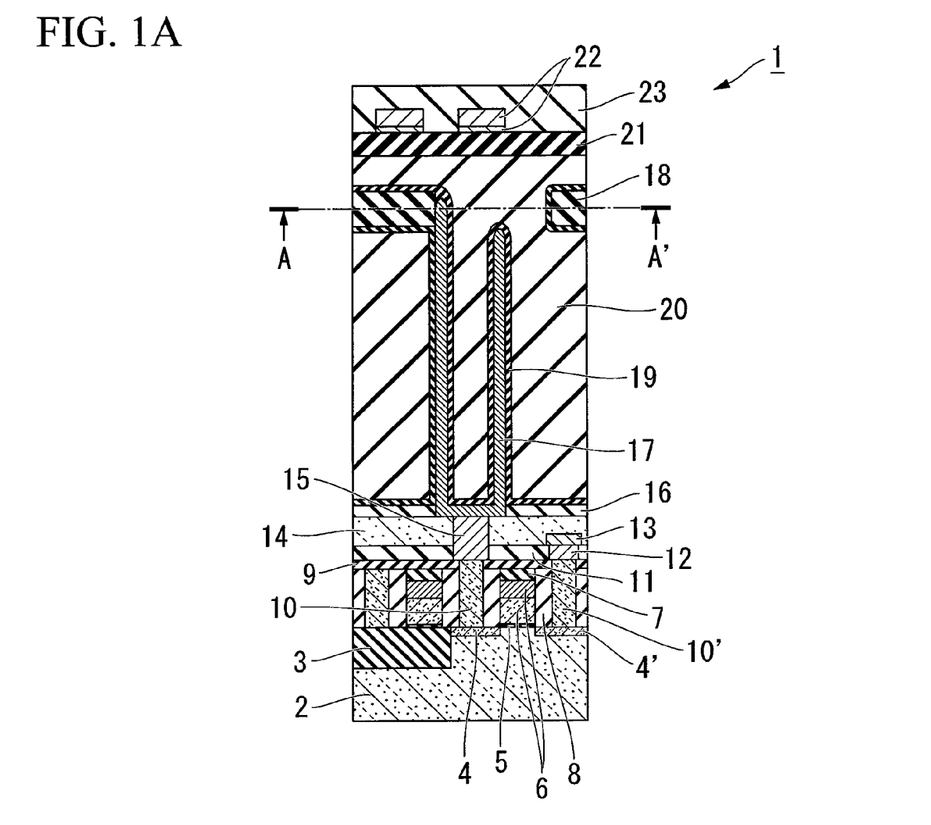
FIG. 1A is a cross-sectional view taken along line B-B' shown in FIG. 1B and illustrates a semiconductor device manufactured by a method of manufacturing a semiconductor device according to a first embodiment of the present invention.
Figure 1B:
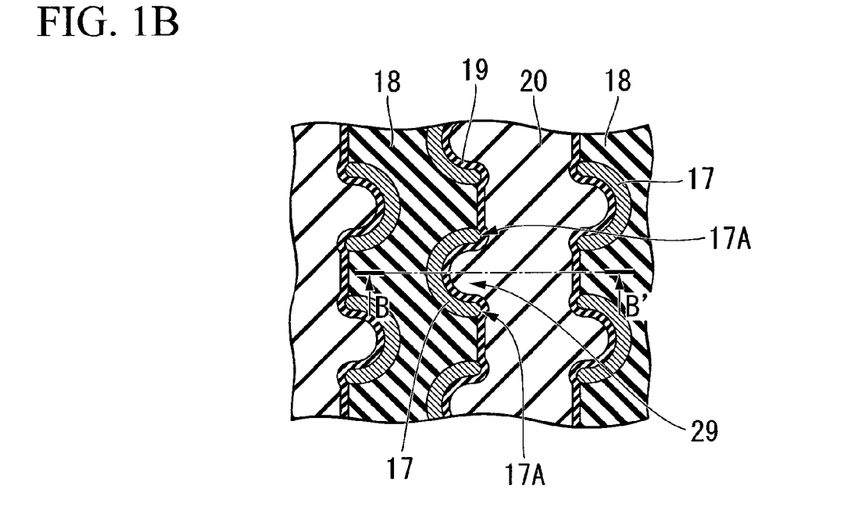
FIG. 1B is a plan view taken along line A-A' shown in FIG. 1A.

Hereinafter, a semiconductor device manufactured by a method of manufacturing a semiconductor device according to a first embodiment of the present invention is explained. FIGS. 1A and 1B are cross-sectional views illustrating a semiconductor device 1 manufactured by the method of the first embodiment.

The semiconductor device 1 includes a cylindrical memory cell capacitor of DRAM (Dynamic Random Access Memory). Specifically, an element isolation region 3 and diffusion layers 4 and 4' are formed in a semiconductor substrate 2 included in the semiconductor device 1. A gate insulating film 5 is formed on the semiconductor substrate 1. A gate electrode 6 is formed on the gate insulating film 5. A gate nitride film 7 is formed on the gate electrode 6. A nitride film spacer 8 is formed on the semiconductor substrate 1 so as to cover side surfaces of the gate insulating film 5, the gate electrode 6, and the gate nitride film 7. A gate upper-inter-layer film 9 is formed so as to cover the nitride film spacer 8. Cell contact plugs 10 and 10' are formed so as to penetrate the gate upper-inter-layer film 9 and the nitride film spacer 8. Bottom surfaces of the cell contact plug 10 and 10' are connected to the diffusion layers 4 and 4', respectively.

A cell-contact-plug upper-inter-layer film 11 is formed over the gate upper-inter-layer film 9. A bit-line contact plug 12 is formed so as to penetrate the cell-contact-plug upper-inter-layer film 11. An upper surface of the cell contact plug 10' is connected to the bit-line contact plug 12. A bit line 13 is formed on the bit-line contact plug 12.

A bit-line upper-inter-layer film 14 is formed on the cell-contact-plug upper-inter-layer film 11 so as to cover the bit line 13. A capacitor contact plug 15 is formed so as to penetrate the bit-line upper-inter-layer film 14 and the cell-contact-plug upper-inter-layer film 11. An upper surface of the cell contact plug 10 is connected to the capacitor contact plug 15. A stopper insulating film 16 is formed over the bit-line upper-inter-layer film 14.

A charge storage electrode 17 is formed so as to penetrate the stopper insulating film 16. The charge storage electrode 17 is U-shaped and cylindrical in cross-sectional view. A lower surface of the charge storage electrode 17 is connected to the capacitor contact plug 15. An upper surface of the charge storage electrode 17 is connected to the support film 18 and mechanically supported by the support film 18. A capacitor insulating film 19 covers the stopper insulating film 16, and outer surfaces of the charge storage electrode 17 and the support film 18.

An upper electrode 20 is formed so as to cover the stopper insulating film 16, the charge storage electrode 17, and the support film 18, which are covered by the capacitor insulating film 19. An upper-electrode upper-inter-layer film 21 is formed over the upper electrode 20. A wiring 22 is formed on the upper-electrode upper-inter-layer film 21. A wiring upper-inter-layer film 23 is formed so as to cover the wiring 22 and the upper-electrode upper-inter-layer film 21.

FIG. 1B is a cross-sectional view taken along line A-A' shown in FIG. 1A. An upper portion of the charge storage electrode 17 has a cutout portion 29. An edge portion 17A of the cutout portion 29, which extends in a direction perpendicular to the semiconductor substrate 2, is an angled portion which is smoothly-curved. In other words, the feature of the semiconductor device 1 is that the angled portion of the edge portion 17A is smoothly-curved.

Hereinafter, a method of manufacturing a semiconductor device according to a first embodiment of the present invention is explained. The method of the first embodiment schematically includes: a first process of forming a first insulating film over a substrate and forming a second insulating film over the first insulating film; a second process of forming a hole penetrating the second insulating film and extending into the first insulating film; a third process of forming an electrode covering bottom and side surfaces of the hole, the electrode being in U-shape in plan view; a fourth process of forming a mask having a hole partially exposing upper surfaces of the electrode and the second insulating film; a fifth process of removing a portion of the second insulating film, which is exposed through the hole, by dry etching using the mask to form a hole penetrating the second insulating film, and of partially removing the upper portion of the electrode exposed through the hole to form a cutout portion on the upper portion of the electrode; and a sixth process of partially removing the edge of the cutout portion by isotropic etching.

Hereinafter, each of the first to sixth processes is explained in detail with reference to FIGS. 2 to 10. In the first process, a first insulating film is formed over the substrate, and then a second insulating film is formed over the first insulating film.

Specifically, an element isolation region 2 and element formation regions are formed in the semiconductor substrate 2. The semiconductor substrate 2 includes, for example, a silicon substrate, a germanium material, a silicon germanium material, and the like. Alternatively, the semiconductor substrate 2 may include an SOI (Silicon-On-Insulator) substrate and the like.

Then, the gate insulating film 5, the gate electrode 6, and the gate nitride film 7 are sequentially formed in the element formation regions. Then, patterning is carried out to form word lines. Then, the diffusion layers 4 and 4' are formed by ion implantation using the word lines as masks. Then, the nitride film spacer 8 is formed so as to cover a side surface of the word line. Then, the gate upper-inter-layer film 9 is formed so as to cover the gate nitride film 7 and the nitride film spacer 8.

Then, the contact plugs 10 and 10' are formed so as to penetrate the gate upper-inter-layer film 9 and to be connected to the diffusion regions 4 and 4', respectively. Then, the cell-contact-plug upper-inter-layer film 11 is formed over the gate upper-inter-layer film 9 and the contact plugs 10 and 10'. Then, the bit-line contact plug 12 is formed so as to penetrate the cell-contact-plug upper-inter-layer film 11.

Then, the bit line 13 is formed so as to be connected to the bit-line contact plug 12. The bit-line upper-inter-layer film 14 is formed over the bit line 13. Cross-sectional views indicative of a process flow illustrating the processes so far are omitted here (see FIG. 1).

Figure 2:
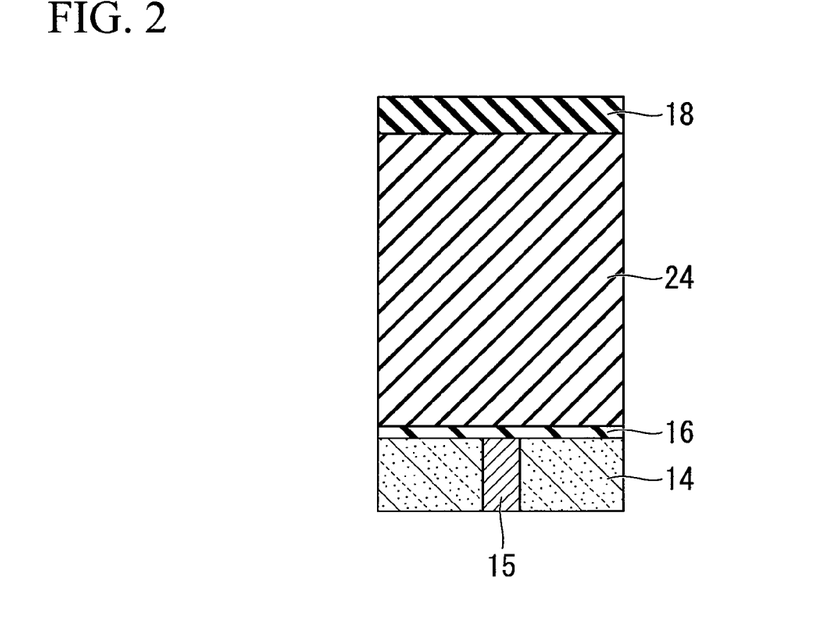

Then, the capacitor contact plug 15 is formed in the bit-line upper-inter-layer film 14 so as to be connected to the cell contact plug 10, as shown in FIG. 2. Then, the stopper insulating film 16 is formed over the capacitor contact plug 15. The stopper insulating film 16 includes a nitride film and has a thickness of, for example, 100 nm. In the first embodiment, the semiconductor substrate 2 up to the stopper insulating film 16 are collectively called a "substrate."

Then, the capacitor inter-layer film (first insulating film) 24 and the support film (second insulating film) 18 are sequentially formed over the stopper insulating film 16 included in the substrate. The capacitor inter-layer film 24 includes, for example, a silicon oxide film, and has a thickness of, for example, 1.5 μm. Alternatively, the capacitor inter-layer film 24 may include, a BPSG (Boro-Phospho Silicate Glass) film, an SOG (Spin-On-Glass) film, and the like.

The support film 18 includes, for example, a silicon nitride film and has a thickness of, for example, 100 nm. Alternatively, the support film 18 may include a material, such as a tantalum oxide film, which can achieve the selectivity with respect to etching of the capacitor inter-layer film 24.

In the second process, a hole is formed so as to penetrate the second insulating film and to extend into the first insulating film. In other words, a capacitor hole 25 for forming a lower electrode of the capacitor is formed by photolithography and dry etching.

Figure 3:
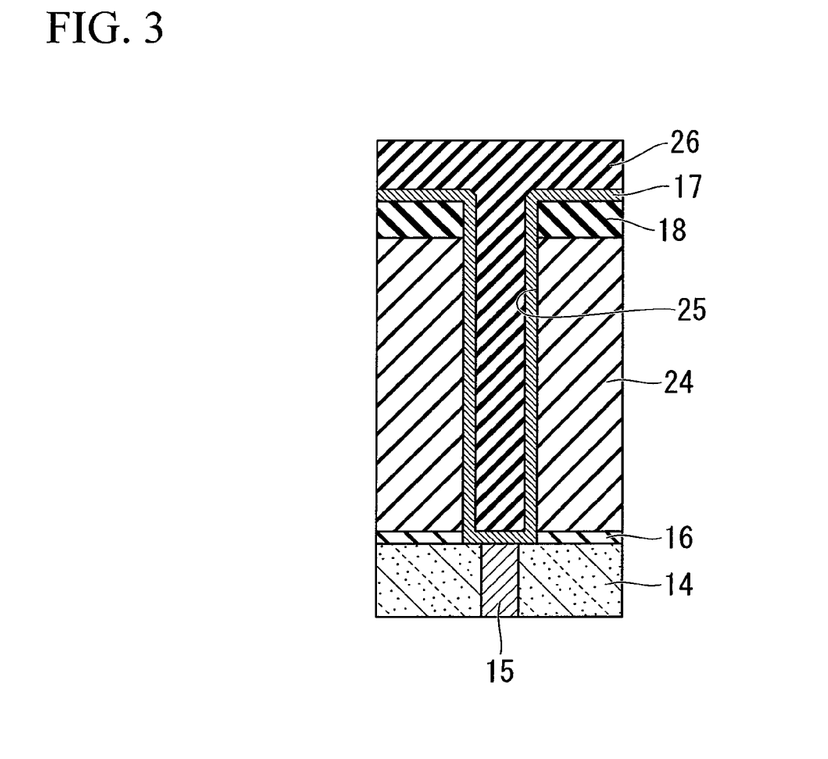

Specifically, a cylindrical capacitor hole 25 is formed so as to penetrate the support film (second insulating film) 18, the capacitor inter-layer film (second insulating film) 24, and the stopper insulating film 16 and to expose an upper surface of the capacitor contact plug 15, as shown in FIG. 3.

In the third process, an electrode, which is in U-shape in cross-sectional view, is formed so as to cover bottom and side surfaces of the hole. Specifically, the charge storage electrode film 17 is formed so as to cover the bottom and side surfaces of the capacitor hole 25 and side and upper surfaces of the support film 18. The charge storage electrode film 17 includes, for example, a titanium nitride film and has a thickness of, for example, 30 nm. Alternatively, the charge storage electrode film 17 may include a multi-layered film including a titanium film and a titanium nitride film having thicknesses of 10 nm and 20 nm, respectively. The charge storage electrode film 17 is formed not to completely fill the capacitor hole 25.

Then, a protection insulating film 26 is formed so as to fill the capacitor hole 25 covered by the charge storage electrode film 17. The protection insulating film 26 includes, for example, a silicon oxide film and has a thickness of, for example, 100 nm.

Figure 4A:
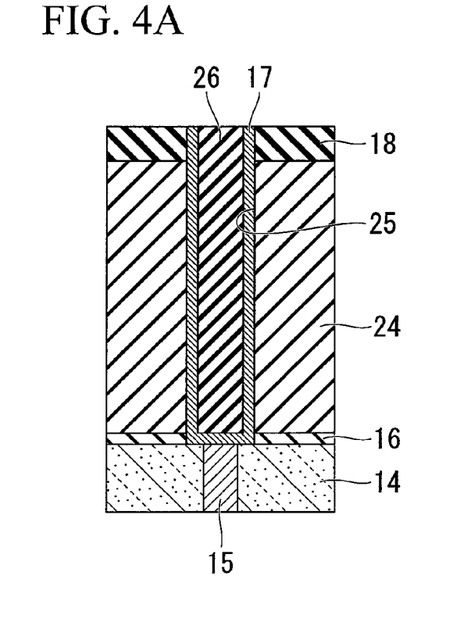

Then, the protection insulating film 26 and the charge storage electrode film 17, which cover an upper surface of the support film 18, are sequentially removed by CMP (Chemical Mechanical Polishing), as shown in FIG. 4A. Thus, the charge storage electrode 17 is formed in the capacitor hole 25. The charge storage electrode 17 is in U-shape in cross-sectional view. The protection insulating film 26 fills the space formed by the bottom and side surfaces of the charge storage electrode 17. As the method of removing the protection insulating film 26 and the charge storage electrode film 17 which are formed over the support film 18, dry-etching may be used in lieu of the CMP.

Figure 4B:
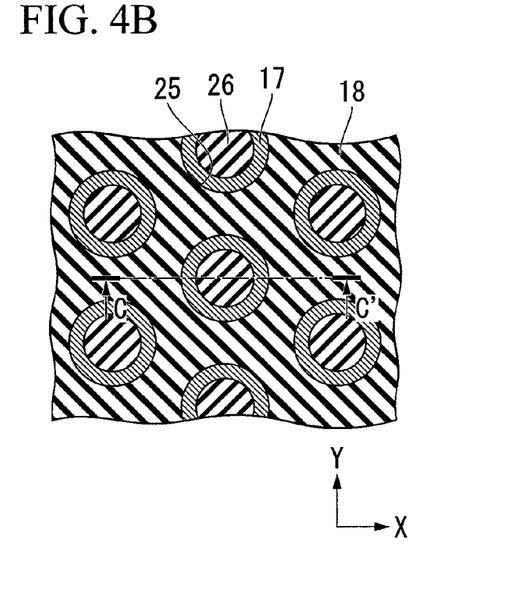
FIGS. 4B, 5B, 7B, 8B, 9B, and 10B are plan views indicative of the process flow illustrating the method of the first embodiment.

The capacitor hole 25 has a substantially-elliptical shape as shown in FIG. 4B. The capacitor holes 25 are arranged with high density in plan view. In the second process of the first embodiment, the minimum feature size of the photolithography was 100 nm (F=100 nm), the size of the capacitor hole 25 in the long-side direction was approximately 220 nm, the size of the capacitor hole 25 in the short-side direction was approximately 200 nm, and the distance between adjacent electrodes was approximately 100 nm.

FIG. 4A illustrates a cross-section of the capacitor hole 25 in the short-side direction. The diameter of the capacitor hole 25 is approximately 180 nm. Hereinafter, X and Y axes denote the short-side and long-side directions of the charge storage electrode 17, respectively.

In the fourth process, a mask is formed over the electrode and the second insulating film. The mask has a hole partially exposing upper surfaces of the electrode and the second insulating film.

Figure 5A:
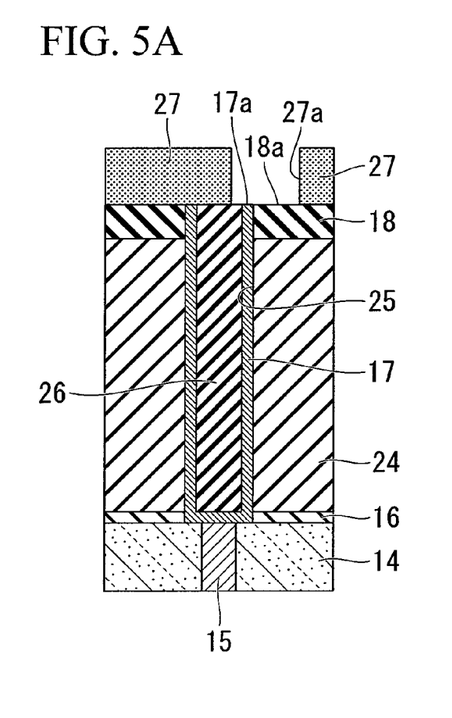
Figure 5B:
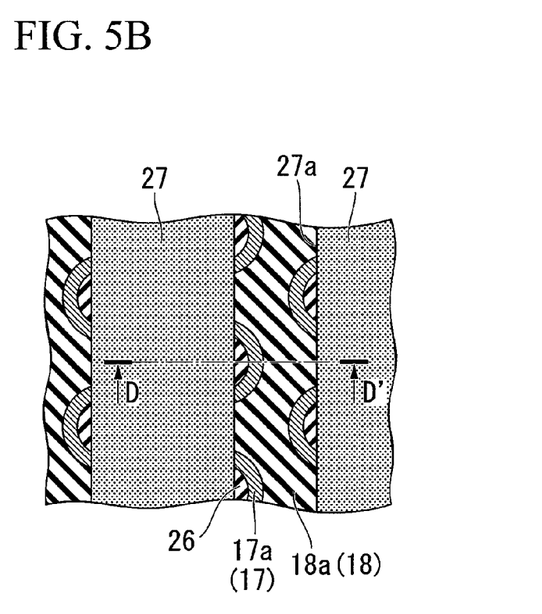

Specifically, a photoresist film is formed over the support film 18, the charge storage electrode 17, and the protection insulating film 26, as shown in FIGS. 5A and 5B. A hole 27a is formed by photolithography so as to partially expose upper surfaces 17a and 18a of the charge storage electrode 17 and the support film 18, respectively. Thus, a photoresist mask 27 having the hole 27a is formed. The hole 27a is provided for forming the pouring hole 28 as will be explained later. The hole 27a has a diameter of, for example, 150 nm.

In the first embodiment, approximately two thirds of the upper surface of the charge storage electrode 17 in the short-side direction is covered by the photoresist mask 27. Additionally, approximately one third of the upper surface of the charge storage electrode 17 in the short-side direction, which is approximately 50 nm in horizontal size, is exposed through the hole 27a, as shown in FIG. 5B. Regarding the layout of the charge electrode 17 of the first embodiment, the opening pattern shown in FIG. 9 of Japanese Patent Laid-Open Publication No. 2008-283026 is used, and the length of the charge storage electrode 17 in the longitudinal direction, which is exposed through the hole 27a, is longer than that of the above document.

In the photolithography process of the first embodiment, misalignment within ±20 nm occurs due to the precision of superposition of an exposure apparatus. Additionally, a variation in size of the hole 27a within ±15 nm occurs due to a manufacturing variation in the exposing and developing processes. Therefore, in the first embodiment, a variation in position of the hole 27a with respect to the charge storage electrode 17 occurs within ±35 nm.

In the fifth process, the second insulating film exposed through the hole 27a is removed by dry etching using the photoresist mask 27 to form a hole in the second insulating film. Additionally, an upper portion of the electrode exposed though the hole is removed to form a cutout portion.

Figure 6:
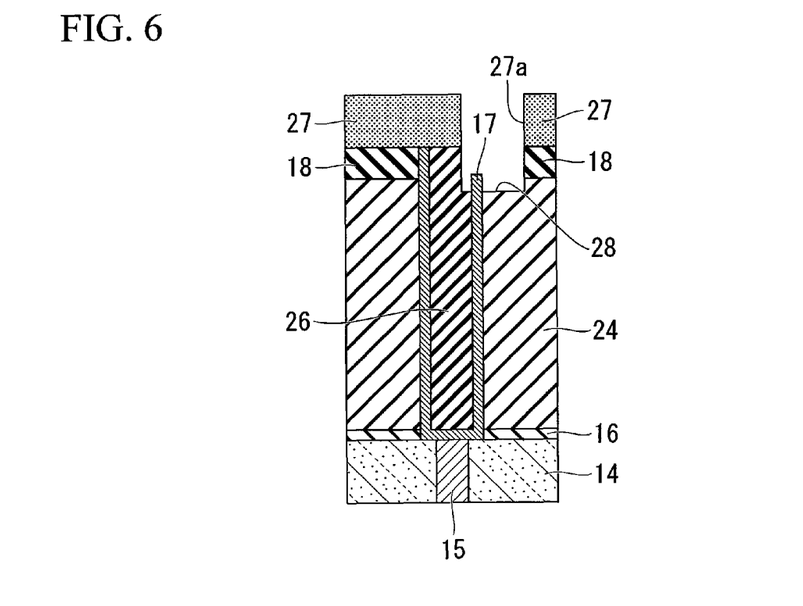

Specifically, the support film 18 exposed through the hole 27a is removed by anisotropic dry etching using the photoresist mask 27, as shown in FIG. 6. When the support film 18 is etched, the protection insulating film 26 and the capacitor inter-layer film 24, which are positioned under the support film 18, are etched at the same time. Thus, the pouring hole 28 is formed. A $CF_4$ containing gas may be used for the anisotropic dry etching.

Additionally, the upper surface 17a of the charge storage electrode 17 exposed through the hole 27a of the photoresist mask 27 is also etched. Specifically, in the first embodiment, the charge storage electrode 17 is etched by approximately 80 nm in the height direction. Thus, an upper portion of the charge storage electrode 17, which is exposed through the hole 27a of the photoresist mask 27, is cut by forming the pouring hole 28, and thereby the cutout portion 29 is formed, as shown in FIG. 7B. Then, an etching surface 28a, which extends in a direction perpendicular to the substrate, is formed along the edge of the hole 27a of the photoresist mask 27. The etching surface 28a is the sidewall of the pouring hole 28. The charge storage electrode 17 is different in etching rate from the support film 18, the protection insulating film 26, and the capacitor inter-layer film 24. For this reason, the top surface of the charge storage electrode 17 in the pouring hole 28 is higher in level than the bottom surface of the pouring hole 28. In this case, even if the level difference between the top surface of the charge storage electrode 17 and the bottom surface of the pouring hole 28 is vary large, the following process of rounding the edge portion 17A can be properly carried out.

Figure 7A:
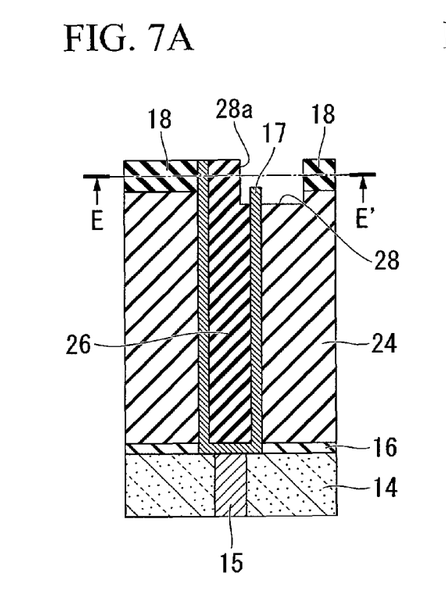
Figure 7B:
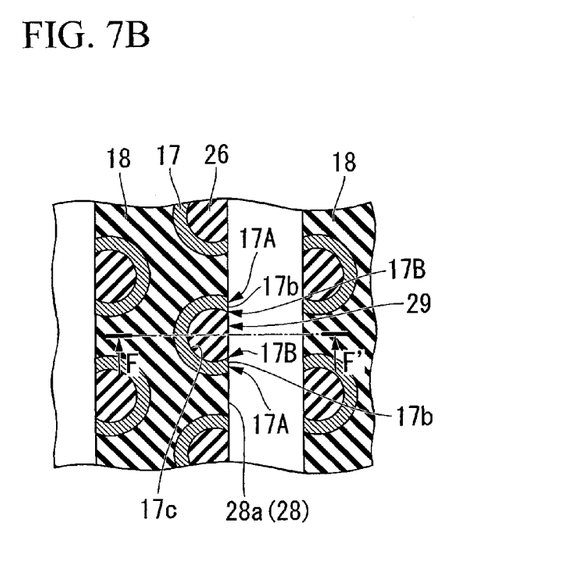

Then, the photoresist mask 27 is removed as shown in FIG. 7A. As shown in FIG. 7B, the edge portion 17A of the cutout portion 29 of the charge storage electrode 17 has an etching surface (side surface) 17b that connects to the etching surface 28a. Additionally, an angled portion 17B is formed at the connection between the etching surface 17b and an inner surface 17c of the charge storage electrode 17. The angled portion 17B has an acute angle of, for example, 50 degree. It is assumed in FIG. 7B that misalignment and a variation in size have not occurred in the photolithography process for forming the hole 27a of the photoresist mask 27.

The upper edge of charge storage electrode 17 includes a connected portion and a separated portion. The connected portion is connected to the support film 18. The separated portion is separated from the support film 18. In the first embodiment, from the standpoint of preventing the charge storage electrode 17 from falling, the connected portion is preferably higher in level than the separated portion. This is because the charge storage electrode 17 is easily removed from the support film 18 if the separated portion is higher in level than the connected portion.

Figure 8A:
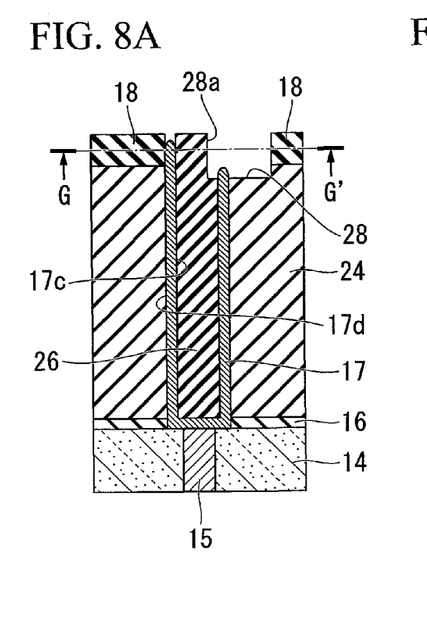
Figure 8B:
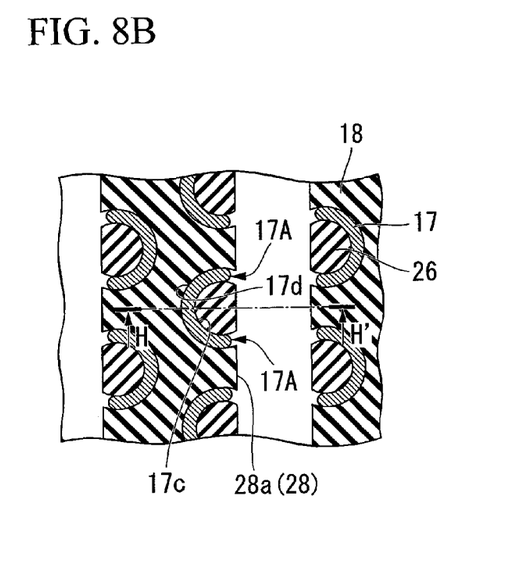

In the sixth process, an upper portion of the cutout portion is partially removed by isotropic etching. Specifically, the exposed portion of the charge storage electrode 17 is isotropically etched. As shown in FIGS. 8A and 8B, the inner side surface 17c of the charge storage electrode 17 is protected by the protection insulating film 26. An outer side surface 17d of the charge storage electrode 17 is protected by the capacitor inter-layer film 24. Accordingly, the upper surface of the charge storage electrode 17 shown in FIG. 8A and the etching surface 17b of the edge portion 17A of the cutout portion 29 shown in FIG. 8B are exposed.

Then, the upper surface of the charge storage electrode 17 and the etching surface 17b are etched by isotropic wet etching. An APM (Ammonia Peroxide Mixture) may be used as an etching solution. The ammonia peroxide mixture is generated by combining ammonia, hydrogen peroxide, and water. The etching rate of the titanium nitride film and the titanium film with respect to the APM is 20 (nm/min). On the other hand, the etching rate of the silicon nitride film and the silicon oxide film with respect to the APM is 0.5 (nm/min). In other words, the selectivity of the titanium nitride film or the titanium film to the silicon nitride film or the silicon oxide film is 40 to 1.

In the first embodiment, etching is carried out for one minute using the APM so that the titanium nitride film is etched by 20 nm. Thus, the upper surface of the charge storage electrode 17 is etched by approximately 20 nm in the height direction, and the top edge of the charge storage electrode 17 is rounded, as shown in FIG. 8A. Additionally, the etching surface 17b of the cutout portion 29 is etched toward the support film 18 by approximately 20 nm in plan view, and the edge portion 17A is rounded, as shown in FIG. 8B. In other words, the angled portion 17B, which has had the angle of 50 degrees as shown in FIG. 7B, is removed.

Preferably, the isotropic etching is carried out such that more than half the charge storage electrode 17 in the thickness direction is etched. By the etching under the condition, the edge portion 17A of the charge storage electrode 17 can be rounded. Accordingly, the electric field can be prevented from focusing on the edge portion 17A of the charge storage electrode 17 of the capacitor, and therefore an increase in leakage current can be prevented.

The etching solution used for the isotropic etching is not limited to the APM, another solution may be used as long as the solution contains hydrogen peroxide, such as SPM (Sulfate Peroxide Mixture) and HPM (Hydrochloric Peroxide Mixture).

As the amount of the isotropic etching increases, the height of the charge storage electrode 17 decreases, as shown in FIG. 8A. As the connected portion of the charge storage electrode 17, which is in contact with the support film 18, decreases, the support strength of the support film 18 decreases. For this reason, the amount of the isotropic etching is preferably small.

Figure 9A:
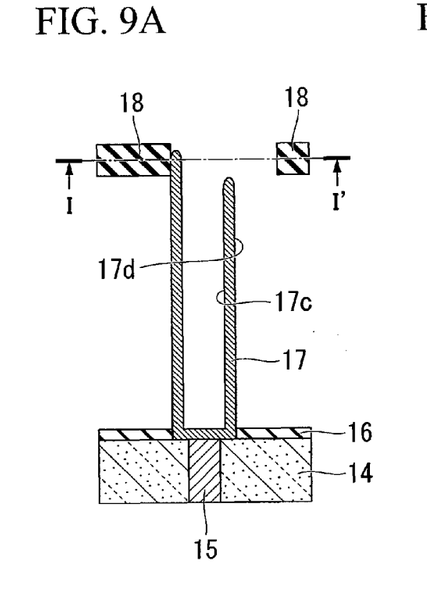

In the seventh process, the first insulating film 24 is selectively etched to expose the outer side surface of the electrode. Specifically, the capacitor inter-layer film 24 and the protection insulating film 26 are selectively removed by etching so as to expose the inner side surface 17c and the outer side surface 17d of the charge storage electrode 17, as shown in FIG. 9A. This etching may be carried out by wet etching with HF (hydrofluoric acid).

The etching rate of the silicon oxide film with respect to the HF is 1 (μm/min). The selectivity of the silicon oxide film to the silicon nitride film is 80 to 1. In the first embodiment, the etching is carried out for two minutes to remove the capacitor inter-layer film 24. In this case, the support film 18 made of the silicon nitride film is etched by approximately 25 nm from the upper surface thereof. Therefore, the thickness of the support film 18 becomes 50 nm in the height direction.

Figure 9B:
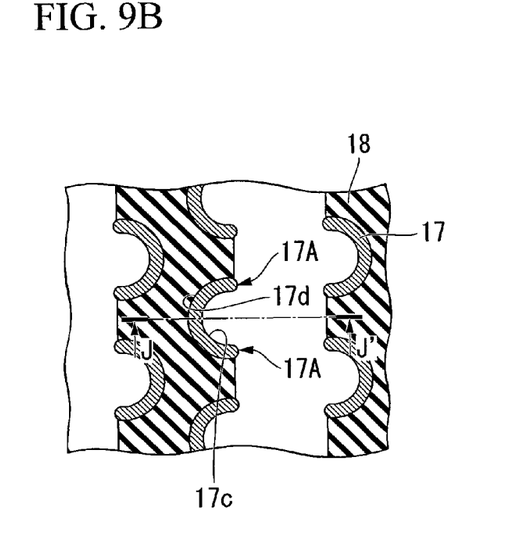

The support film 18 is etched by 25 nm in the horizontal direction, as shown in FIG. 9B. Accordingly, the edge portion 17A of the charge storage electrode 17 protrudes, in plan view, from the edge of the support film 18 by approximately 5 nm.

Regarding a conventional manufacturing method, an etching for rounding the edge portion 17A of the charge electrode 17 is not carried out. For this reason, the edge portion 17A of the charge electrode 17 protrudes, in plan view, from the edge of the support film 18 by approximately 25 nm after the capacitor inter-layer film 24 and the protection insulating film 26 are etched. As explained above, a capacitor, in which a capacitor insulating film and an upper electrode are formed so as to cover the charge storage electrode 17 whose edge portion 17A protrudes from the edge of the support film 18, causes an increase in current characteristics of the capacitor.

When the edge portion 17A of the charge storage electrode 17, which protrudes from the edge of the support film 18, is formed after the capacitor inter-layer film 24 and the protection insulating film 26 are etched without carrying out the etching to round the edge portion 17A, the edge portion 17A is weak against force vertically applied to the charge storage electrode 17, i.e., is weak against bending stress, since the cutout portion 29 is formed by removing a part of the charge storage electrode 17. Further, the protruding edge portion 17A is likely to deform, and therefore thermal stress applies to the capacitor insulating film 19 in a high-temperature process after the capacitor insulating film 19 is formed, thereby causing the capacitor insulating film 19 to crack.

Moreover, as a result of investigation of the relationship between the protruding amount of the edge portion 17A from the edge of the support film 18 and the capacitor characteristic, it has been confirmed that a degradation of the capacitor characteristic can be prevented by reducing the protruding amount of the edge portion 17A to half or less the thickness of the charge storage electrode 17.

As explained above, according to the manufacturing method of the first embodiment, the process of partially removing, by isotropic etching, the edge of the cutout portion of the charge storage electrode 17, i.e., the sixth process of rounding the angled portion 17B of the edge portion 17A, is provided. For this reason, the protruding amount of the edge portion 17A of the charge storage electrode 17 from the edge of the support film 18, after the capacitor inter-layer film 24 and the protection insulating film 26 are etched, can be reduced. Accordingly, the edge portion 17A can tolerate thermal stress in the high-temperature process after the formation of the capacitor insulating film 19, thereby preventing degradation of the electric characteristic of the capacitor.

Figure 10A:
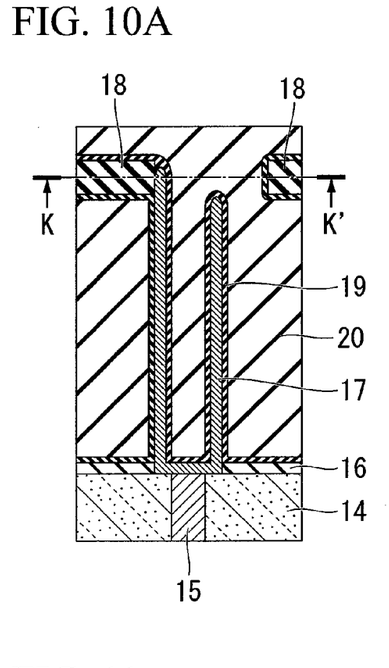
Figure 10B:
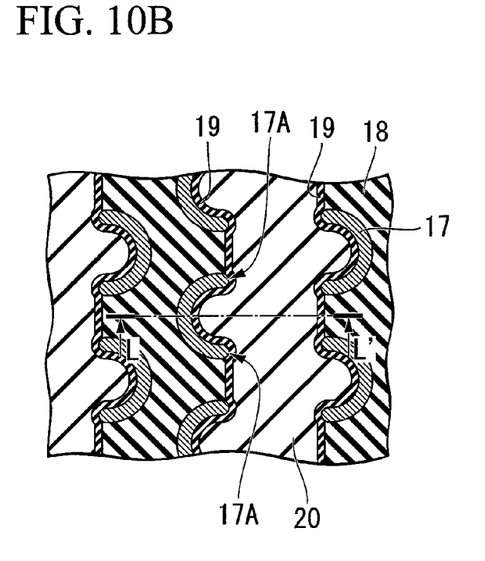

Then, the capacitor insulating film 19 is formed so as to cover the stopper insulating film 16, the charge storage electrode 17, and the support film 18, which are exposed, as shown in FIGS. 10A and 10B. The capacitor insulating film 19 is formed in a thickness of 10 nm by ALD (Atomic Layer Deposition) using, for example, a hafnium oxide ($HfO_2$) film. The capacitor insulating film 19 may include a high dielectric constant film, such as a tantalum oxide ($Ta_2O_5$) film, a zirconium oxide ($ZrO_2$) film, and the like.

Then, the upper electrode 20 is formed so as to cover the stopper insulating film 16, the charge storage electrode 17, and the support film 18, which are covered by the capacitor insulating film 19, as shown in FIGS. 10A and 10B. Specifically, a titanium nitride (TiN) film in the thickness of 30 nm is formed by ALD. Then, a tungsten (W) film in the thickness of 50 nm is formed by CVD over the titanium nitride film. Finally, the upper electrode 20 is formed by patterning. Alternatively, a doped poly-silicon may be grown over the titanium nitride film so as to fill the space between adjacent cylindrical capacitors having the three-dimensional structure, and then the tungsten film may be formed over the doped poly-silicon film.

Then, the upper-electrode upper-inter-layer film 21 is formed over the upper electrode 20. Then, a contact (not shown) is formed so as to be connected to the bit line 13. Then, the wiring 22 is formed over the upper-electrode upper-inter-layer film 21 so as to be connected to the contact. Finally, the wiring upper-inter-layer film 23 is formed over the wiring 22. Thus, the semiconductor device 1 shown in FIG. 1 can be formed.

As explained above, according to the method of manufacturing a semiconductor device of the first embodiment, the edge portion 17A, which is a part of the edge of the charge storage electrode 17, is rounded, thereby preventing the electric field from focusing on the edge portion 17A of the charge storage electrode 17. Accordingly, the semiconductor device 1 including a capacitor, which can prevent an increase in leakage current, can be manufactured.

Second Embodiment

Hereinafter, a method of manufacturing a semiconductor device according to a second embodiment of the present invention is explained. The second embodiment explains an etching method for rounding the edge portion 17A, which is different from the method of the first embodiment. Like reference numerals denote like elements, and an explanation thereof is omitted here.

Although the exposed surface of the charge storage electrode 17 is isotropically etched by wet etching in the sixth process of the first embodiment, dry etching may be carried out in lieu of the wet etching. The dry etching is carried out with a chlorine containing gas.

Specifically, the isotropic dry etching is carried out using an ICP (Inductively Coupled Plasma) etcher as an etching apparatus under the condition that the flow rate of chlorine gas is 100 sccm ($1.7\times10^{-1}$ Pa·m³/sec), the bias power is 30 W, the source power is 300 W, and the pressure is 20 mTorr (2.7 Pa).

The etching rate of the dry etching is 5 (nm/sec). Therefore, the dry etching is carried out for approximately 4 seconds, and thereby the titanium nitride film included in the charge storage electrode 17 can be etched by approximately 20 nm. Therefore, the edge portion 17A of the charge storage electrode 17 can be rounded.

As explained above, according to the method of manufacturing a semiconductor device according to the second embodiment, the same effect as that of the first embodiment can be achieved without using the wet etching process.

Third Embodiment

Hereinafter, a method of manufacturing a semiconductor device according to a third embodiment of the present invention is explained with reference to FIGS. 11 to 15. In the first and second embodiments, the upper portion of the charge storage electrode 17 is etched to be shortened in the height direction in the sixth process. For this reason, the connection portion of the charge storage electrode 17 and the support film 18 decreases. The third embodiment explains an etching method that does not shorten the charge storage electrode 17.

The difference between the first and third embodiments is the fourth process, and other processes are the same. Therefore, like reference numerals denote like elements, and an explanation thereof is omitted here.

Figure 11:
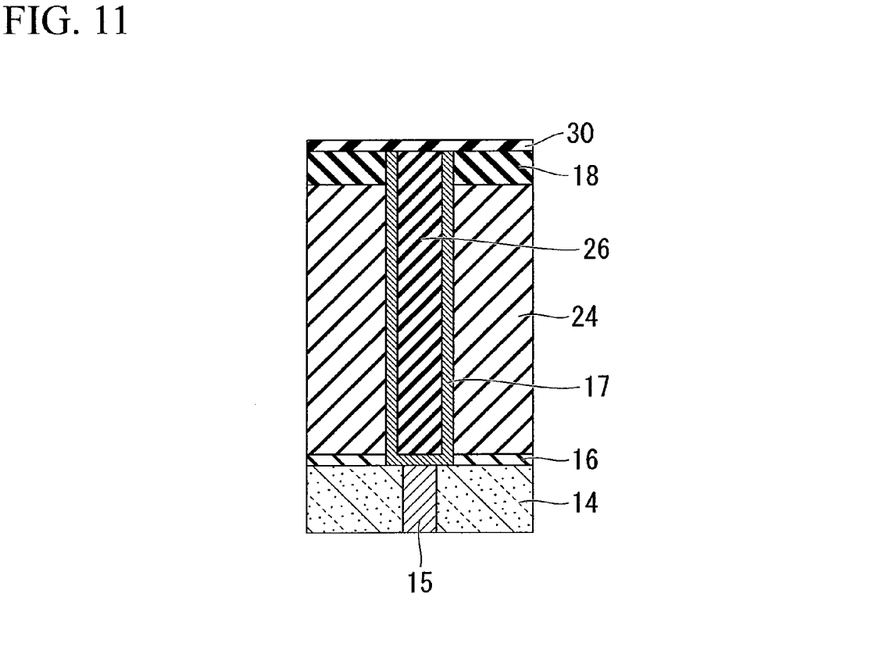
FIGS. 11 to 15 are cross-sectional views indicative of a process flow illustrating a method of manufacturing a semiconductor device according to a third embodiment of the present invention.

In the fourth process of the third embodiment, a mask insulating film 30 is formed so as to cover the support film 18, the charge storage electrode 17, and the protection insulating film 26, as shown in FIG. 11. Then, the photoresist mask 27 is formed over the mask insulating film 30, as shown in FIG. 12.

Figure 12:
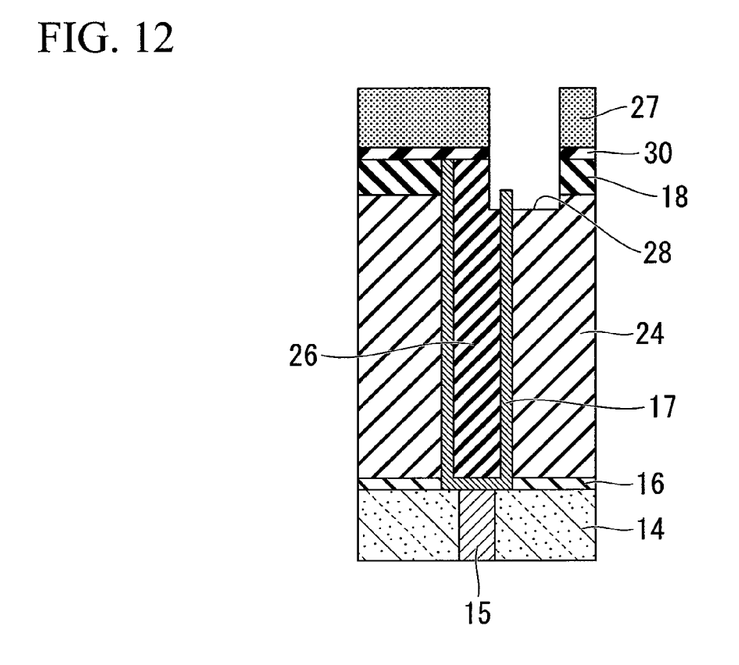
Figure 13:
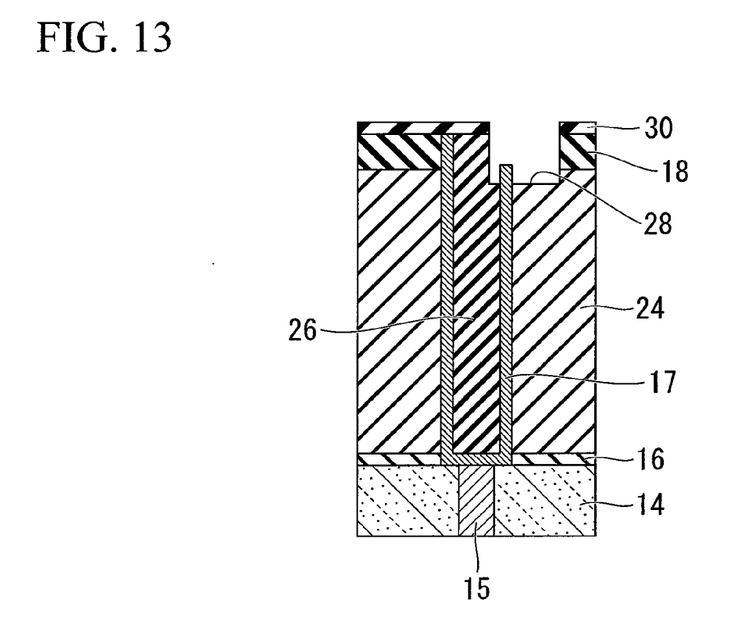

Then, in the fifth process of the third embodiment, the pouring hole 28 is formed by etching with the photoresist mask 27, similarly to the first embodiment, as shown in FIG. 12. Then, only the photoresist mask 27 is removed as shown in FIG. 13. In this case, the mask insulating film 30 remains in the third embodiment, and therefore only portions under the pouring hole 28 are exposed.

Figure 14:
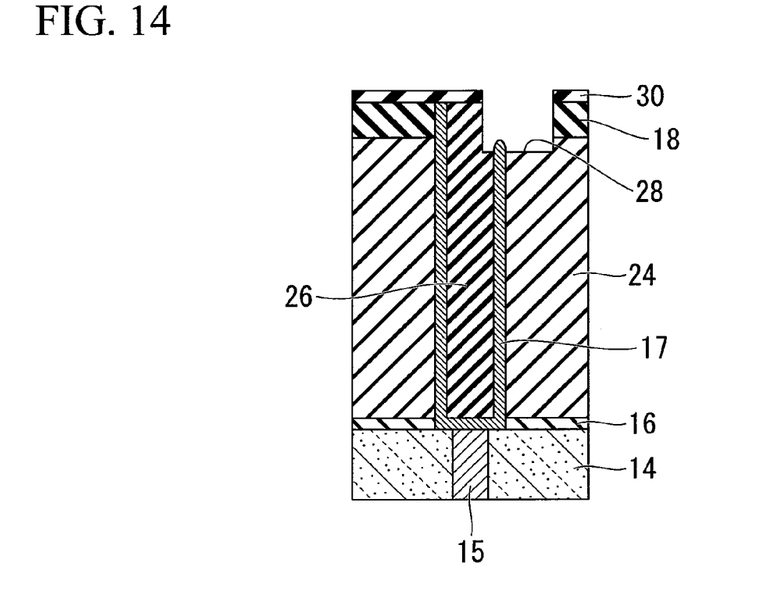

Then, in the sixth process of the third embodiment, the edge of the charge storage electrode 17 is etched by isotropic etching to be rounded as shown in FIG. 14. The dry etching of the second embodiment may be used as the isotropic etching. In this case, the connected portion of the charge storage electrode 17 and the support film 18 is not etched since the connected portion is covered by the mask insulating film 30.

Figure 15:
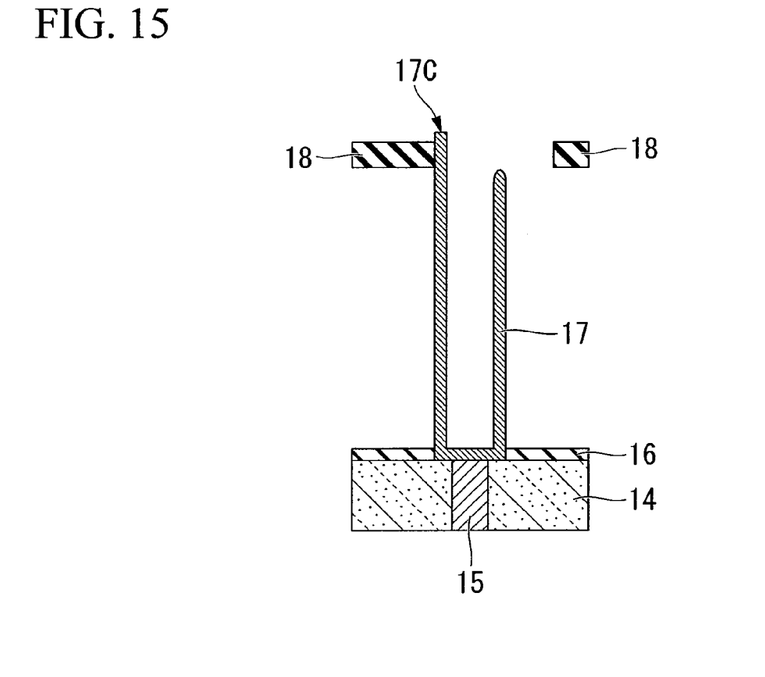

Then, in the seventh process of the third embodiment, the capacitor inter-layer film 24 and the protection insulating film 26 are etched similarly to the first embodiment, as shown in FIG. 15. Thus, the support film 18 is etched by approximately 25 nm in the horizontal direction, similarly to the first embodiment. In this case, an upper edge portion 17C of the charge storage electrode 17 is not etched in the sixth process of the third embodiment. For this reason, the connected portion of the charge storage electrode 17 and the support film 18 sufficiently remain in the height direction, thereby enhancing the strength of the support film 18 that mechanically supports the charge storage electrode 17.

Fourth Embodiment

Hereinafter, a method of manufacturing a semiconductor device according to a fourth embodiment of the present invention is explained with reference to FIGS. 16 to 18. The fourth embodiment explains an etching method without using the mask insulating film 30, by which the height of the charge storage element 17 does not decrease in the sixth process.

The difference between the first and fourth embodiments is the fifth and sixth processes, and other processes are the same. Therefore, like reference numerals denote like elements, and an explanation thereof is omitted here.

Figure 16:
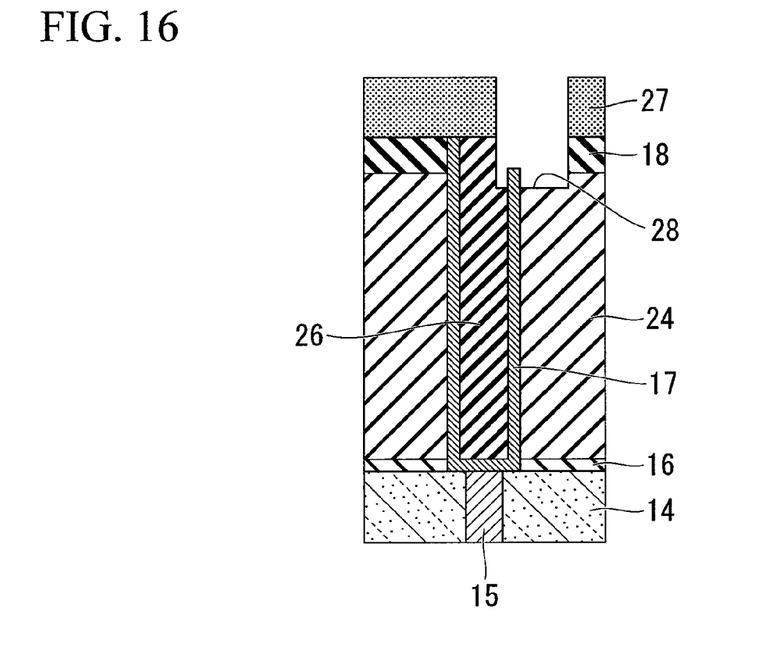
FIGS. 16 to 18 are cross-sectional views indicative of a process flow illustrating a method of manufacturing a semiconductor device according to a fourth embodiment of the present invention.

In the fifth process of the fourth embodiment, the pouring hole 28 is formed similarly to the first embodiment, as shown in FIG. 16. In the fourth embodiment, the photoresist mask 27 is not removed after the formation of the pouring hole 28, and then the following sixth process is carried out.

Figure 17:
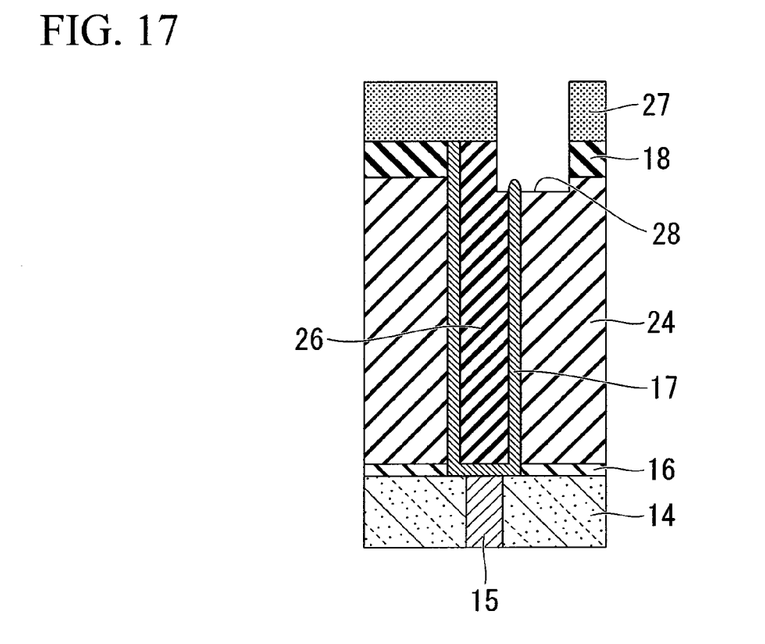

In the sixth process of the fourth embodiment, the edge portion of the charge storage electrode 17 is etched by isotropic etching to be rounded while the photoresist mask 27 remains, as shown in FIG. 17. The dry etching of the second embodiment is used as the isotropic etching. In the fourth embodiment, an upper surface of the connected portion of the charge storage electrode 17 and the support film 18 is covered by the photoresist mask 27, and therefore is not etched. In other words, the upper surface of the connected portion of the charge storage electrode 17 and the support film 18 can be protected without formation of the mask insulating film 30 of the third embodiment.

Figure 18:
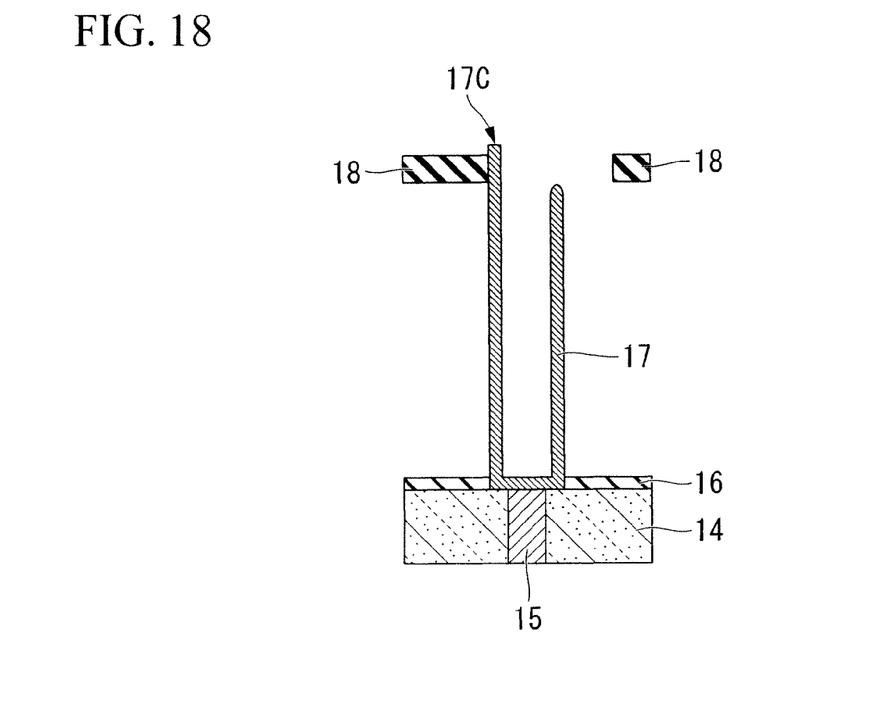

Then, in the seventh process of the fourth embodiment, the photoresist mask 27 is removed, and then the capacitor inter-layer film 24 and the protection insulating film 26 are etched similarly to the first embodiment, as shown in FIG. 18. Thus, the support film 18 is etched by approximately 25 nm in the horizontal direction, similarly to the first embodiment. In this case, the upper portion 17C of the charge storage electrode 17 is not etched in the sixth process of the fourth embodiment, the connected portion of the charge storage electrode 17 and the support film 18 can sufficiently remain in the horizontal direction. Accordingly, the support strength of the support film 18 that mechanically supports the charge storage electrode 17 can be enhanced.

As explained above, according to the method of manufacturing a semiconductor device of the fourth embodiment, a semiconductor device having the same structure as that of the third embodiment can be manufactured at low cost without forming the mask insulating film 30.

As used herein, the following directional terms "forward," "rearward," "above," "downward," "vertical," "horizontal," "below," and "transverse," as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

It is apparent that the present invention is not limited to the above embodiments, but may be modified and changed without departing from the scope and spirit of the invention.

For example, although a titanium nitride film is used in the first to the fourth embodiments as an example of a material of the charge storage electrode 17, the material of the charge storage electrode 17 is not limited thereto. A high melting point metal film, such as a titanium (Ti) film and a tungsten (W) film, or a multi-layered film including these films, may be used.

What is claimed is:

1. A method of manufacturing a semiconductor device, comprising:
   forming a first insulating film over a substrate;
   forming a second insulating film on the first insulating film;
   forming an electrode penetrating the first and the second insulating films;
   removing a part of the second insulating film and a part of the electrode so that a first hole is formed in the second insulating film, a first portion of the electrode being exposed through the first hole; and
   removing a part of the first portion of the electrode by an isotropic etching.

2. The method according to claim 1, wherein removing the part of the first portion of the electrode comprises rounding at least one surface of the first portion of the electrode.

3. The method according to claim 1, wherein the isotropic etching is performed by wet etching using a solution containing at least one of ammonia peroxide mixture, sulfate peroxide mixture, and hydrochloric peroxide mixture.

4. The method according to claim 1, wherein forming the electrode comprises:
   forming a capacitor hole penetrating the first and the second insulating films; and
   forming an electrode film covering a bottom surface and a side surface of the capacitor hole.

5. The method according to claim 4, further comprising:
   forming a first mask over the electrode film and the second insulating film after forming the electrode film, the first mask having a second hole partially overlapping the electrode film on the side surface of the capacitor hole in plan view; and
   etching the part of the second insulating film and a part of the electrode film using the first mask so that the first portion of the electrode remains under the second hole.

6. The method according to claim 5, wherein the first portion has a first top surface and a first side surface, the first side surface being defined by an edge of the second hole, and the first top surface and the first side surface are rounded by the isotropic etching.

7. The method according to claim 5, wherein the first mask is formed by a photoresist film, and the first mask is removed before performing the isotropic etching.

8. The method according to claim 5, further comprising:
   after forming the electrode film, forming a third insulating film filling the capacitor hole, the first mask being formed after forming the third insulating film.

9. The method according to claim 8, further comprising:
   after removing the part of the first portion of the electrode, removing the first insulating film and the third insulating film to expose an outer surface and an inner surface of the electrode.

10. The method according to claim 5, further comprising:
    before forming the first mask, forming a mask insulating film on the electrode film and the second insulating film, the first mask being formed on the mask insulating film, a hole defined by the second hole being formed in the mask insulating film; and
    removing the first mask before performing the isotropic etching, wherein the mask insulating film remains on the electrode during the isotropic etching.

11. The method according to claim 1, further comprising:
    after removing the part of the first portion of the electrode, removing the first insulating film to expose an outer surface of the electrode.

12. The method according to claim 11, further comprising:
    after removing the first insulating film, forming a capacitor insulating film on the outer surface of the electrode; and
    forming an upper electrode on the capacitor insulating film.

13. The method according to claim 1, wherein the electrode comprise: at least one material of titanium, titanium nitride, and tungsten.

14. The method according to claim 1, wherein the isotropic etching is performed by dry etching using a chlorine gas.

15. A method of manufacturing a semiconductor device, comprising:
    forming a first insulating film over a substrate;
    forming a second insulating film on the first insulating film;
    forming a capacitor hole penetrating the second insulating film and the first insulating film;
    forming an electrode film covering a bottom surface and a side surface of the first capacitor hole;
    forming a mask on the electrode and the second insulating film, the mask having a second hole, the second hole being disposed over a part of the capacitor hole;
    removing a part of the second insulating film and a part of the electrode film by dry etching so that a first hole is formed in the second insulating film, the first hole being defined by the second hole, a first portion of the electrode film being exposed through the first hole;
    removing the mask; and
    removing a part of the first portion of the electrode by an isotropic etching.

16. The method according to claim 15, wherein a part of the first insulating film under the second hole is removed by removing the part of the second insulating film and the part of the electrode film.

17. The method according to claim 16, wherein the isotropic etching is performed by wet etching using a solution including hydrogen peroxide water.

18. The method according to claim 17, further comprising:
    after removing the part of the first portion of the electrode, removing the first insulating film to expose an outer surface of the electrode film;
    forming a capacitor insulating film on the outer surface of the electrode film; and
    forming an upper electrode on the capacitor insulating film.

19. The method according to claim 16, wherein the isotropic etching is performed by dry etching.

20. The method according to claim 19, further comprising:
    after removing the part of the first portion of the electrode, removing the first insulating film to expose an outer surface of the electrode film;
    forming a capacitor insulating film on the outer surface of the electrode film; and
    forming an upper electrode on the capacitor insulating film.

* * * * *